United States Patent
Collins et al.

(10) Patent No.: US 11,705,390 B2
(45) Date of Patent: Jul. 18, 2023

(54) VARIABLE IN-PLANE SIGNAL TO GROUND REFERENCE CONFIGURATIONS

(71) Applicant: Intel Corporation, Santa Clara, CA (US)

(72) Inventors: Andrew Collins, Chandler, AZ (US); Arghya Sain, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 941 days.

(21) Appl. No.: 16/366,034

(22) Filed: Mar. 27, 2019

(65) Prior Publication Data

US 2020/0312759 A1    Oct. 1, 2020

(51) Int. Cl.
*H01L 23/66* (2006.01)
*H01L 23/498* (2006.01)

(52) U.S. Cl.
CPC ........ *H01L 23/49838* (2013.01); *H01L 23/66* (2013.01); *H01L 2223/6616* (2013.01); *H01L 2223/6638* (2013.01)

(58) Field of Classification Search
CPC ................................................ H01L 23/49838
USPC ....................................................... 361/784
See application file for complete search history.

(56) References Cited

U.S. PATENT DOCUMENTS

| | | | | |
|---|---|---|---|---|
| 6,420,778 B1* | 7/2002 | Sinyansky | ........... | H05K 1/0216 257/664 |
| 6,608,258 B1* | 8/2003 | Kwong | .................... | H05K 1/14 361/795 |
| 7,458,854 B1* | 12/2008 | Morgan | ............ | H01R 13/6477 439/607.05 |
| 10,128,965 B1* | 11/2018 | Wilson | .................... | H04B 17/21 |
| 2003/0230807 A1* | 12/2003 | Li | ........................ | H05K 1/0265 438/626 |
| 2008/0096424 A1* | 4/2008 | Bixler | .................. | H01R 12/716 439/607.05 |
| 2016/0174374 A1* | 6/2016 | Kong | .................... | H05K 1/0242 29/829 |
| 2017/0256303 A1* | 9/2017 | Yu | ........................ | H04L 25/0278 |
| 2019/0208619 A1* | 7/2019 | Zhang | .................. | H05K 1/0218 |
| 2019/0269007 A1* | 8/2019 | Sikina | .................... | H05K 3/462 |

* cited by examiner

*Primary Examiner* — Stanley Tso
(74) *Attorney, Agent, or Firm* — Schwabe, Williamson & Wyatt P.C.

(57) ABSTRACT

Embodiments disclosed herein include electronic packages with improved differential signaling architectures. In an embodiment, the electronic package comprises a package substrate, where the package substrate comprises alternating metal layers and dielectric layers. In an embodiment, a first trace is embedded in the package substrate, where the first trace has a first thickness that extends from a first metal layer to a second metal layer. In an embodiment, the electronic package further comprises a first ground plane laterally adjacent to a first side of the first trace, and a second ground plane laterally adjacent to a second side of the first trace.

20 Claims, 12 Drawing Sheets

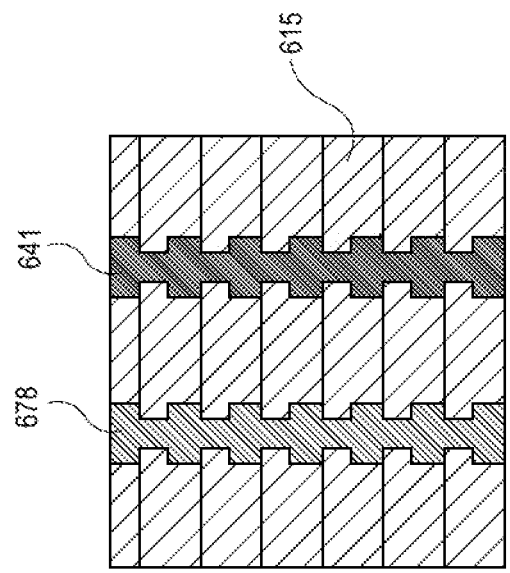
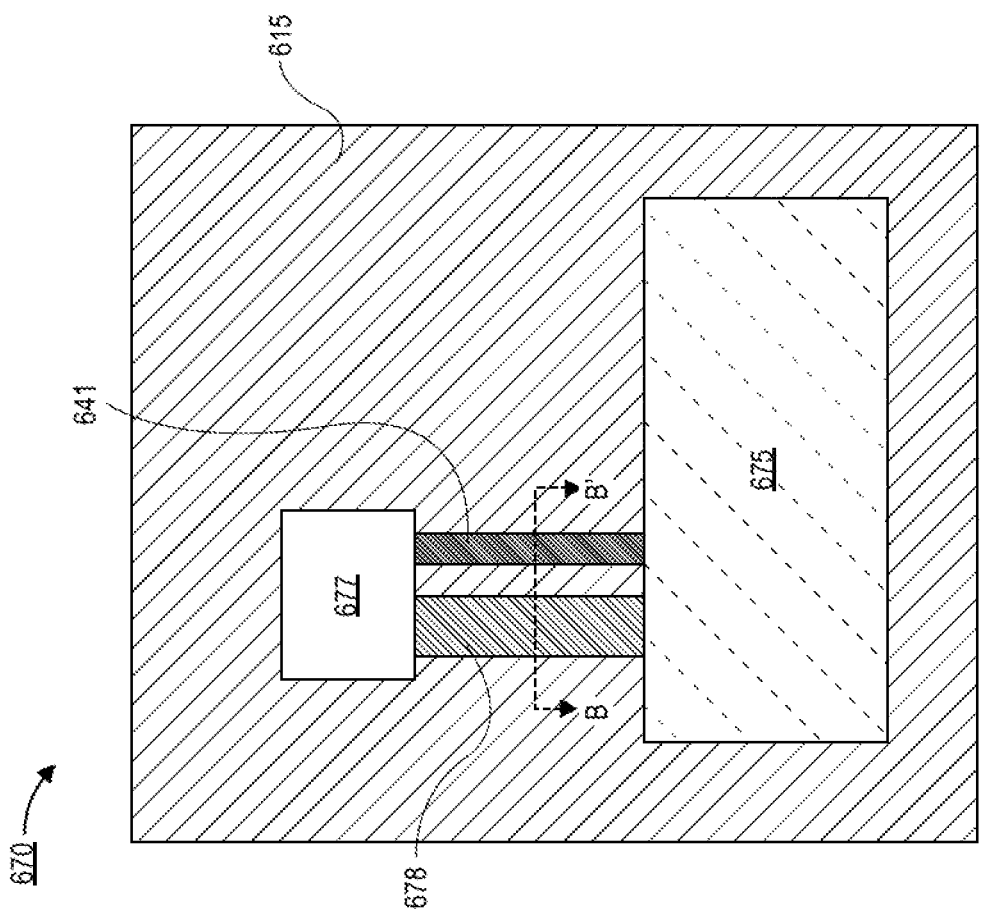
FIG. 6B
FIG. 6A

VARIABLE IN-PLANE SIGNAL TO GROUND REFERENCE CONFIGURATIONS

TECHNICAL FIELD

Embodiments of the present disclosure relate to electronic packaging, and more particularly, to electronic packages with variable in-plane signal to ground references and methods of forming such electronic packages.

BACKGROUND

High performance package designs can have different single ended and high speed differential interfaces which have key signal integrity parameters that are in conflict with one another. For example, single ended memory interfaces are typically cross-talk dominated. Accordingly, moving the traces closer to the ground reference plane is desirable. On the other hand, differential interfaces (e.g., serializer/deserialzer (SERDES), peripheral component interconnect express (PCIe), and the like) are loss dominated. As such, it is desirable to space such traces as far away from the ground reference plane as possible to allow for wider (i.e., lower resistance) trace widths for a fixed target impedance. Standard electronic packages with both loss and cross-talk dominated interfaces must make a choice on dielectric thickness to minimize total signal integrity risk by choosing either higher differential IO insertion loss or higher single-ended IO cross-talk.

One possible solution to routing cross-talk and loss dominated signals within the same electronic package is to implement a "skip layer" type routing for the loss sensitive differential signals. The "skip layer" scheme involves routing the differential pair with the VSS planes on the metal layers directly above/below voided such that the effective dielectric thickness is twice the standard dielectric thickness of the electronic package. The thicker dielectric allows for a wider trace width for a fixed impedance target, which results in lower signal loss per mm. Such "skip layer" architectures force a higher package layer count than traditional routing in order to account for the voided "skip layers". The dielectric thickness variation including multiple dielectric layers would also be higher than standard stack-ups with one dielectric layer. This would force a larger impedance tolerance for the signal routing. The routing density for the differential signals is also reduced due to larger signaling footprint driven by the wider trace width and intra-pair spacing and inter-pair spacing required to meet a fixed cross-talk specification.

Coplanar grounded schemes can also be utilized for in-plane referencing to reduce cross-talk for an interface that does not have a cross-talk optimized signal to ground plane reference on adjacent layers. This coplanar configuration is usually used in low cost, low layer count packages for single ended interferences such as DDR/LPDDR. These die to memory device interconnect lengths are typically fairly short. Furthermore, coplanar reference schemes come with IO density overhead since a ground trace needs to fit between each of the IO traces. Physical signal routing density is significantly below that of the technology limitation due to the VSS traces. From an electrical perspective long VSS traces that are not stitched regularly to ground planes can suffer from noise reflections which adversely impacts cross-talk. Without via stitching the current return path becomes longer, which is not desirable.

Another option is to increase package layer count such that both single ended and differential signal integrity metrics can be met. However, this will add both cost and Z-height to the design, and is therefore, not desirable.

BRIEF DESCRIPTION OF THE DRAWINGS

FIG. 6A is a plan view illustration of an electronic package with an electrical connection from a die to a die side capacitor (DSC), in accordance with an embodiment.

FIG. 6B is a cross-sectional illustration of the electronic package in FIG. 6A along line B-B', in accordance with an embodiment.

EMBODIMENTS OF THE PRESENT DISCLOSURE

Figure 1A:
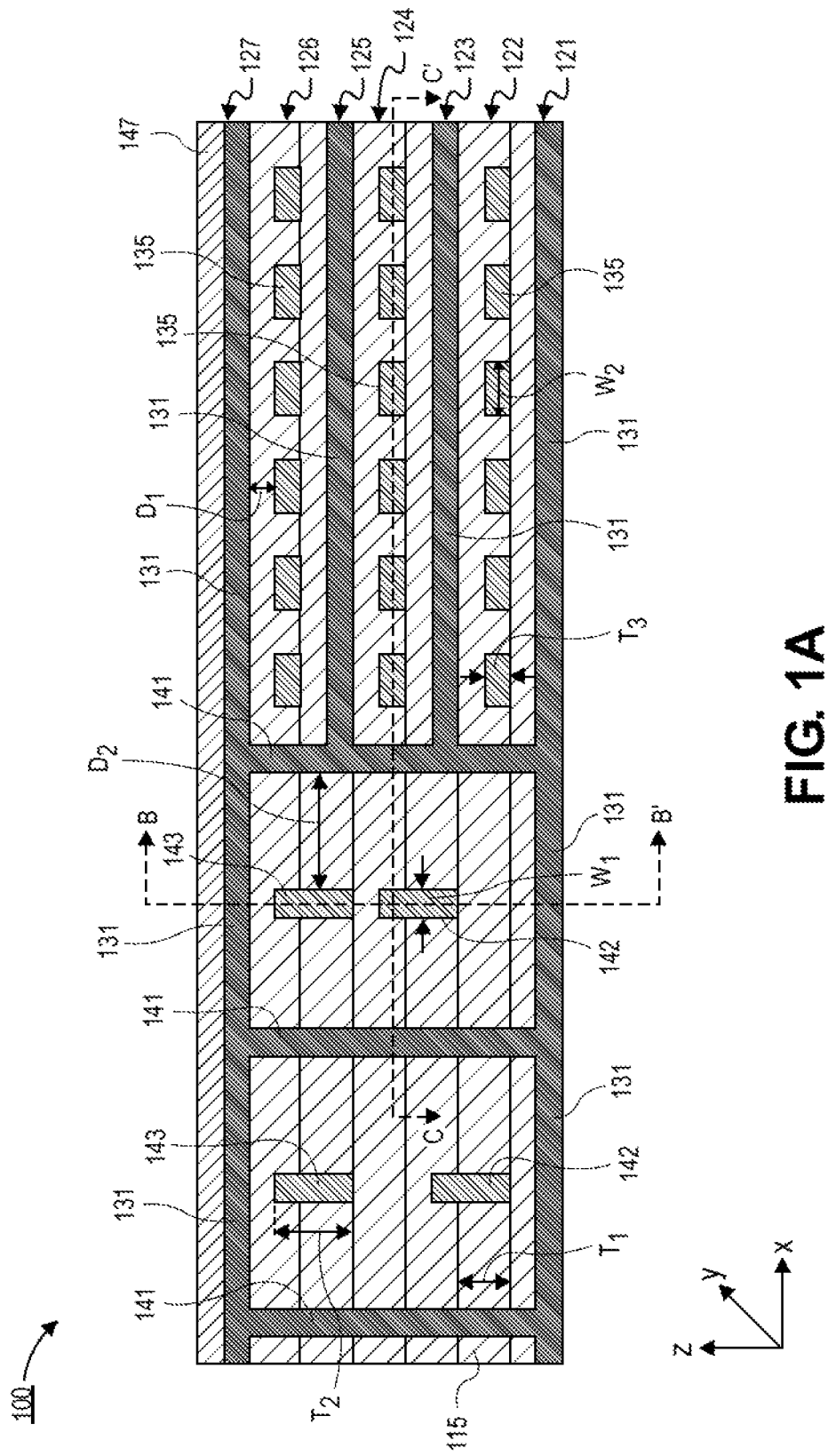
FIG. 1A is a cross-sectional illustration of an electronic package with a plurality of differential signaling traces aligned along a first plane and a plurality of single ended signaling traces aligned along a second plane, in accordance with an embodiment.

Described herein are electronic packages with variable in-plane signal to ground references and methods of forming such electronic packages, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, the design of an electronic package often has to balance competing metrics. Particularly, cross-talk limited signaling paths (e.g., single ended signaling traces) are desired to be close to the ground plane, whereas loss limited signaling paths (e.g., differential signaling traces) are desired to be far from the ground plane. However, the distance to the ground plane is set (at least in part) by the thickness of the dielectric layers used in the electronic package. Accordingly, improving cross-talk comes with the penalty of increased losses, or vice versa.

As such, embodiments disclosed herein include a variable reference scheme that allows for the flexibility to tune the impedance of high speed differential pairs independent of the substrate dielectric thickness. This allows for more flexibility in optimizing the on-package routing for both loss and cross-talk sensitive interfaces. Particularly, embodiments allow for the decoupling of impedance of the differential pairs from the dielectric thickness by providing ground reference planes in the X-direction. This enables the choice of spacing between the differential signaling traces and the ground reference plane to be made independent of the dielectric thickness since the differential signaling traces may be patterned at any X-location to provide a desired spacing. That is, the dielectric thickness may be chosen to minimize cross-talk of single ended signaling traces (i.e., by choosing a small dielectric thickness), and the differential signaling traces may be spaced away from vertically oriented ground reference planes any desired distance to provide a desired impedance to minimize losses.

Such embodiments provide significant performance and manufacturing benefits compared to existing solutions. For example, the insertion loss per millimeter (dB/mm) of embodiments disclosed herein can match the insertion loss per millimeter of skip layer architectures while requiring fewer layers. As such, comparable performance is obtained at a lower cost, and with a reduced Z-height. Particularly, whereas skip layer architectures may require 16 package layers, embodiments disclosed herein may be implemented with similar performance using only 12 package layers. Furthermore, the lanes per millimeter is higher in accordance with embodiments described herein. This allows for more direct bump to ball routing paths on the package, which reduces trace length and total package loss.

Referring now to FIG. 1A, a cross-sectional illustration of an electronic package 100 is shown, in accordance with an embodiment. In an embodiment, the electronic package 100 may comprise alternating dielectric layers 115 and metal layers. For example, seven metal layers 121-127 are shown in FIG. 1A. However, it is to be appreciated that any number of metal layers 121-127 may be included in electronic packages 100 in accordance with various embodiments. In an embodiment, the dielectric layers 115 may be organic dielectrics, and the metal layers 121-127 may comprise any suitable conductive material (e.g., copper or the like). In an embodiment, a solder resist 147 may be positioned over the uppermost metal layer (e.g., metal layer 127).

In an embodiment, the electronic package 100 may comprise single ended signaling traces 135 and differential signaling traces (e.g., trace pairs 142, 143). In an embodiment, the single ended signaling traces 135 may comprise memory interfaces. In an embodiment, the differential signaling traces 142, 143 may comprise serializer/deserialzer (SERDES) interface, peripheral component interconnect express (PCIe) interface, or the like. In order to provide flexibility to optimize performance of the electronic package 100 (e.g., to minimize cross-talk in the singled ended signaling traces 135 and to minimize losses in the differential signaling traces 142, 143), the differential signaling traces 142, 143 may be aligned along a first plane and the single ended signaling traces 135 may be aligned along a second plane.

In a particular embodiment, the first plane may be substantially orthogonal to the second plane. For example, the differential signaling traces 142, 143 may be aligned along a Z-Y plane, and the single ended signaling traces 135 may be along a X-Y plane. In an embodiment, the second plane may be substantially parallel to the stacked dielectric layers 115. Accordingly, the single ended signaling traces 135 may have a distance $D_1$ to ground planes 131 in a parallel plane that is set (at least in part) by the thickness $T_1$ of the dielectric layers 115.

In contrast, a distance $D_2$ between the differential signaling traces 142, 143 and laterally adjacent vertically oriented ground planes 141 are not constrained by the thickness $T_1$ of the dielectric layers 115. Instead, the X-positions of the differential signaling traces 142, 143 and the ground planes 141 may be arbitrarily chosen to provide desired signal integrity metrics. Since the differential signaling traces 142, 143 are loss dominated, the distance $D_2$ may be larger than the distance $D_1$ between single ended signaling traces 135 and ground planes 131.

In an embodiment, the differential signaling traces 142, 143 may be defined by a width $W_1$ and a thickness $T_2$. In a particular embodiment, the thickness $T_2$ may be greater than the width $W_1$. Particularly, the thickness $T_2$ of the differential signaling traces 142, 143 are not constrained by the thickness $T_1$ of the dielectric layers 115. For example, the thickness $T_2$ of the differential signaling traces 142, 143 may be greater than the thickness $T_1$ of the dielectric layers 115. For example, the differential signaling traces 142, 143 may be have a thickness that extends past two or more metal layers. For example, the differential signaling traces 143 extend from the fifth metal layer 125 to the sixth metal layer 126. Increasing the thickness $T_2$ provides a lower resistance, and therefore, a lower impedance. This reduces the losses of the differential signaling traces 142, 143. Furthermore, since the thickness $T_2$ is not constrained by the thickness $T_1$ of the dielectric layer 115, the thickness $T_2$ may be tailored to provide a desired impedance.

In an embodiment, the thickness $T_2$ may be obtained by using a lithographic via patterning process. As such, via trenches may be used to tie together traces on opposing ends of the via trenches. As shown in FIG. 1A, there is no distinguishing junction between the traces and the via trenches. However, as will be described in greater detail below, the traces may be distinguishable from the via trenches in some embodiments due to variations in the widths of the differential signaling traces 142, 143.

Similarly, it is to be appreciated that the ground planes 141 that are positioned along parallel planes to the differential signaling traces 142, 143 (i.e., vertically oriented ground planes 141) may be formed with lithographic via patterning processes. In such embodiments, the ground planes 141 may extend past multiple metal layers. For example, the ground planes 141 in FIG. 1A extend from the first metal layer 121 to the seventh metal layer 127. However, it is to be appreciated that the ground planes 141 need not extend along the entire thickness of the electronic package 100 in some embodiments.

In an embodiment, the single ended signaling traces 135 may have a width $W_2$ and a thickness $T_3$. In contrast to the differential signaling traces 142, 143, the width $W_2$ may be greater than the thickness $T_3$ of the single ended signaling traces 135. The single ended signaling traces 135 may be fabricated with standard electronic package fabrication processes. Additionally, it is to be appreciated that the differential signaling traces 142, 143 and the single ended signaling traces 135 may be fabricated substantially in parallel with each other. That is, the lithographic via patterning to form the differential signaling traces 142, 143 may be implemented between fabrication of a layer of single ended signaling traces 135 and the successive ground plane 131.

Figure 1B:
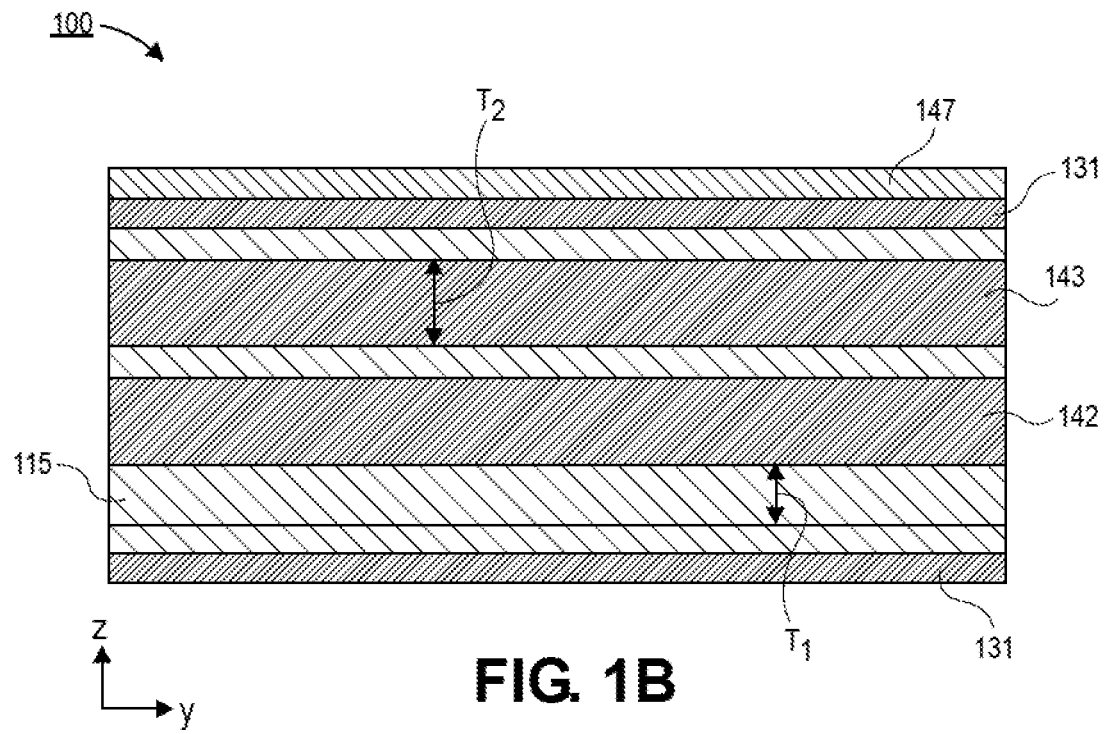
FIG. 1B is a cross-sectional illustration of the electronic package in FIG. 1A along line B-B', in accordance with an embodiment.

Referring now to FIG. 1B, a cross-sectional illustration of the electronic package 100 along line B-B' in FIG. 1A is shown, in accordance with an embodiment. As shown, the differential signaling traces 142, 143 extend along the Y-direction. That is, the differential signaling traces 142, 143 have a substantially uniform thickness $T_2$ along the Y-direction. In an embodiment, the thickness $T_2$ of the differential signaling traces 142, 143 may be greater than the thickness $T_1$ of the dielectric layer 115.

Figure 1C:
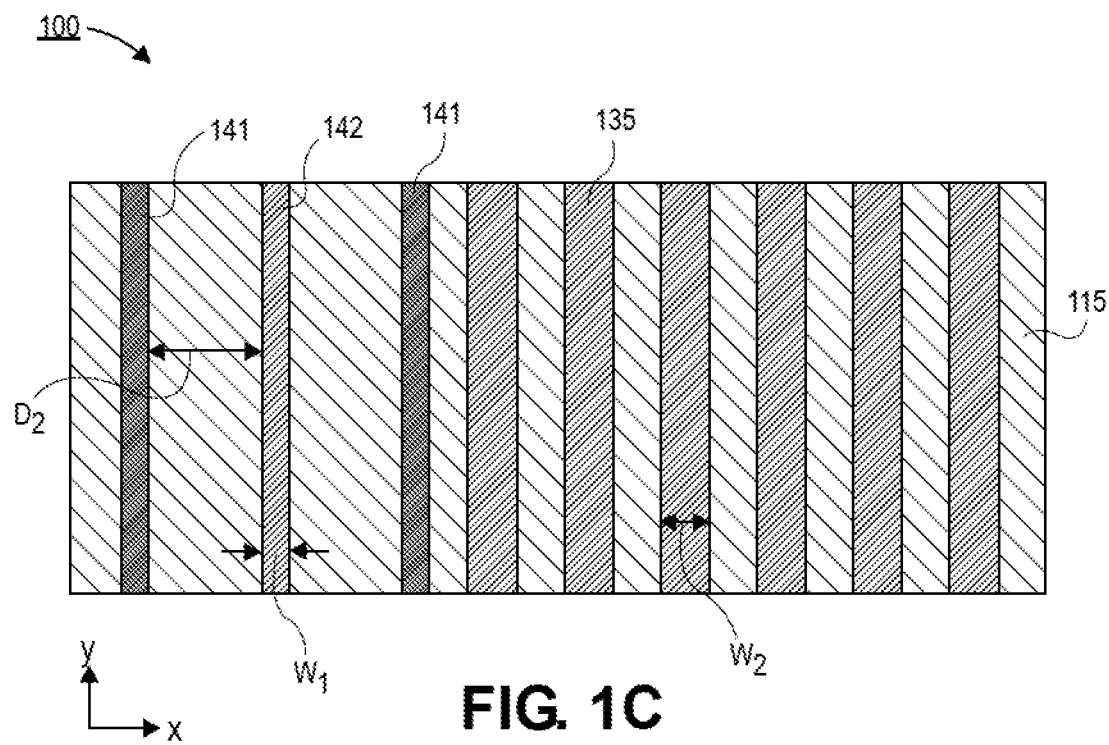
FIG. 1C is a cross-sectional illustration of the electronic package in FIG. 1A along line C-C', in accordance with an embodiment.

Referring now to FIG. 1C, a cross-sectional illustration of the electronic package 100 along line C-C' is shown, in accordance with an embodiment. As shown, the width $W_1$ of the differential signaling trace 142 is less than a width $W_2$ of the single ended signaling traces 135. In an embodiment, the differential signaling trace 142 is spaced a distance $D_2$ from the vertically oriented ground planes 141. The ground plane to which the single ended signaling traces 135 are referenced is out of the plane shown in FIG. 1C.

Figure 2A:
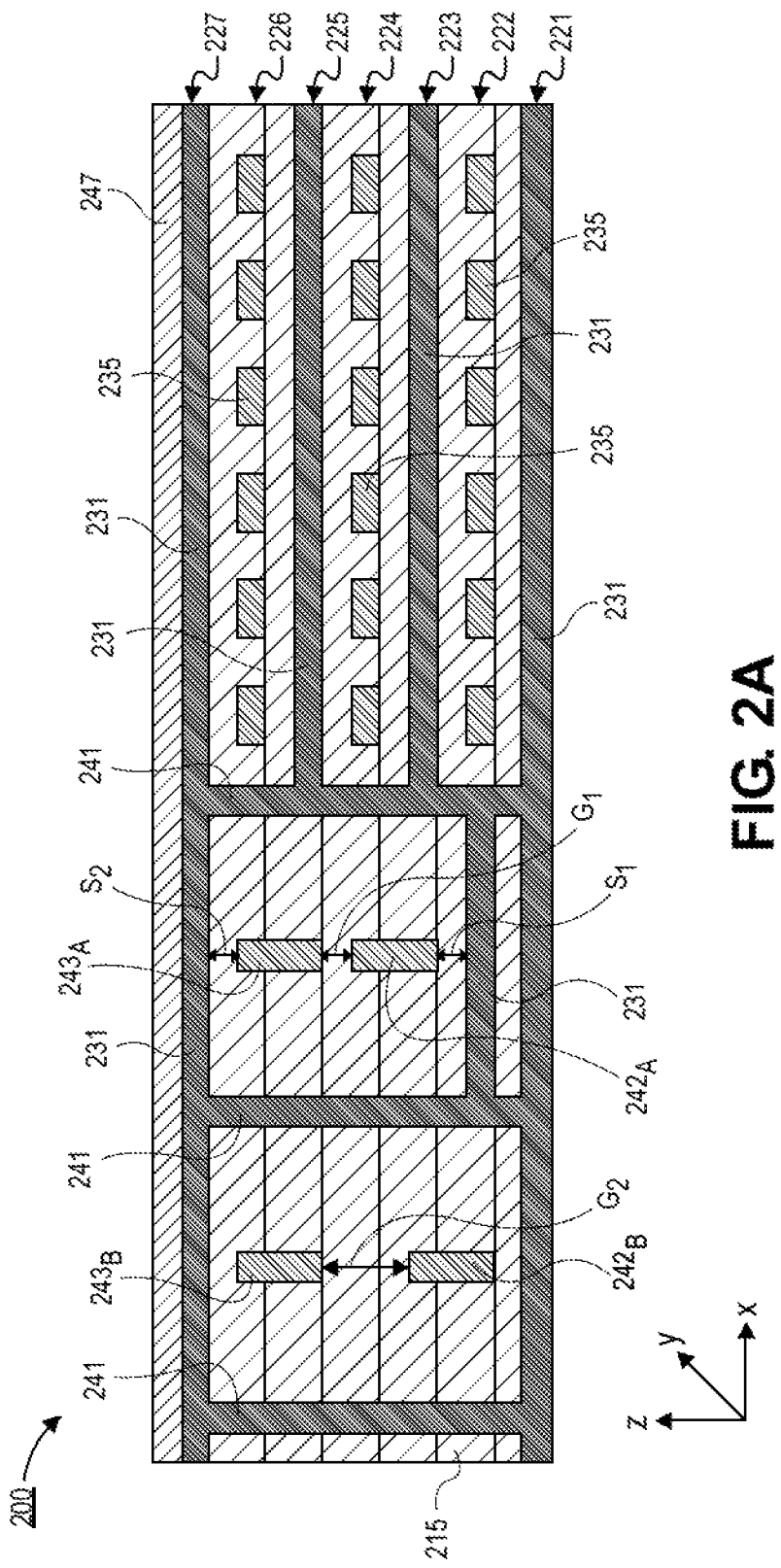
FIG. 2A is a cross-sectional illustration of an electronic package with a first plurality of differential signaling traces and a second plurality of differential signaling trace, where the spacing of the ground planes around the first plurality of differential signaling traces is different than the spacing of the ground planes around the second plurality of differential signaling traces.

Referring now to FIG. 2A, a cross-sectional illustration of an electronic package 200 is shown, in accordance with an additional embodiment. The electronic package 200 in FIG. 2A is substantially similar to the electronic package 100 in FIG. 1A, with the exception that an additional ground plane 231 is positioned below a pair of differential signaling traces $242_A$, $243_A$. The inclusion of the additional ground plane 231 provides a uniform spacing $S_1$ and $S_2$ between the ends of the differential signaling traces $242_A$, $243_A$ and the horizontal ground planes 231. That is, the spacing $S_1$ between the horizontal ground plane 231 in metal layer 222 and the bottom surface of the differential signaling trace $242_A$ is equal to the spacing $S_2$ between the horizontal ground plane 231 in metal layer 227 and the top surface of the differential signaling trace $243_A$.

In an embodiment, not all pairs of differential signaling traces 242, 243 have the same spacing. For example, differential signaling traces $242_A$, $243_A$ may be spaced by a gap $G_1$, and differential signaling traces $242_B$, $243_B$ may be spaced by a gap $G_2$. In an embodiment, the gap $G_1$ may be smaller than the gap $G_2$. However, it is to be appreciated that the gap $G_1$ may be substantially equal to the gap $G_2$, or the gap $G_1$ may be larger than the gap $G_2$ in some embodiments.

In an embodiment, the electronic package 200 may also comprise similar features to those described above with respect to FIG. 1A. That is, the electronic package 200 may comprise alternating metal layers (e.g., metal layers 221-227) and dielectric layers 215. In an embodiment, the single ended signaling traces 235 may be spaced away from horizontal ground planes 231 by portions of the dielectric layers 215. Additionally, vertically oriented ground planes 241 may run substantially parallel to the differential signaling traces 242, 243. In an embodiment, a solder resist 247 may be disposed over a top metal layer 227.

Figure 2B:
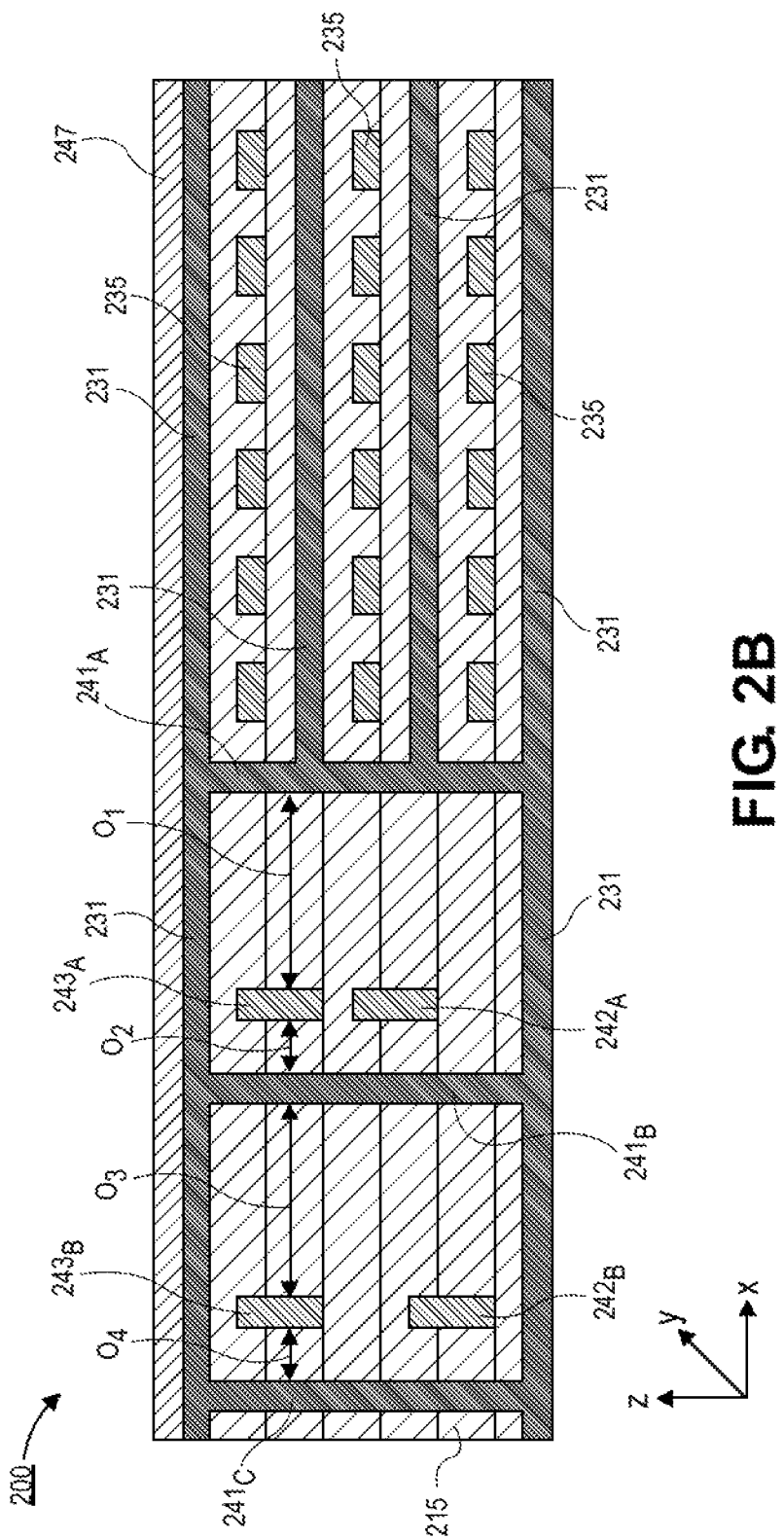
FIG. 2B is a cross-sectional illustration of an electronic package with differential signaling traces that are offset from a center line between ground planes, in accordance with an embodiment.

Referring now to FIG. 2B, a cross-sectional illustration of an electronic package 200 is shown, in accordance with an additional embodiment. In an embodiment, the electronic package 200 may be substantially similar to the electronic package 100 in FIG. 1A, with the exception that the differential signaling traces 242, 243 have a non-uniform offset from the laterally adjacent vertical ground planes 241. For example, the first differential signaling traces $242_A$, $243_A$ may have a first offset $O_1$ from a first vertical ground plane 241A and a second offset $O_2$ from a second vertical ground plane $241_B$. In an embodiment, the first offset $O_1$ is larger than the second offset $O_2$. In other embodiments, the first offset $O_1$ is smaller than the second offset $O_2$.

In an embodiment, the second pair of differential signaling traces $242_B$, $243_B$ may also have a non-uniform offset. For example, the differential signaling traces $242_B$, $243_B$ may have a third offset $O_3$ from the second vertical ground plane $242_B$ that is greater than a fourth offset $O_4$ from a third vertical ground plane $241_C$. In an embodiment, the first offset $O_1$ may be substantially equal to the third offset $O_3$, and the second offset $O_2$ may be substantially equal to the fourth offset $O_4$. However, it is to be appreciated that in other embodiments, the first offset $O_1$ and the third offset $O_3$ need not be equal, nor does the second offset $O_2$ need to be equal to the fourth offset $O_4$.

Referring now to FIGS. 3A-3E, a series of cross-sectional illustrations of a differential signaling trace is shown, in accordance with various embodiments. As shown, the cross-sections of the differential signaling traces (e.g., differential signaling traces 142, 143, 242, or 243 shown in FIG. 1A, 2A, or 2B) may take various cross-sectional profiles depending on the fabrication processes used, and the desired thickness of the differential signaling traces.

Figure 3A:
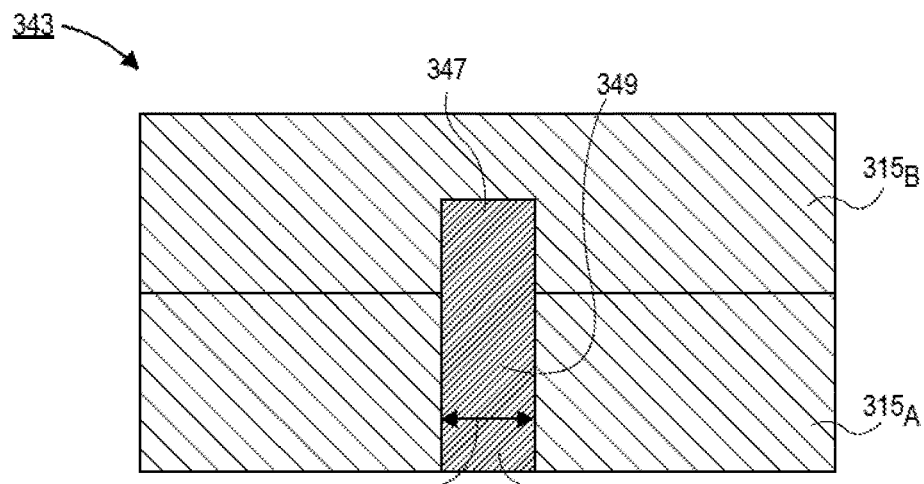
FIG. 3A is a cross-sectional illustration of a differential signaling trace, in accordance with an embodiment.

Referring now to FIG. 3A, a cross-sectional illustration of a differential signaling trace 343 is shown, in accordance with an embodiment. In an embodiment, the differential signaling trace 343 may be embedded in dielectric layers $315_A$ and $315_B$. That is, the differential signaling trace 343 may extend through more than one dielectric layer 315. In an embodiment, the differential signaling trace 343 may comprise a first trace 348, a trench via 349 over the first trace 348, and a second trace 347 over the trench via 349. The first trace 348 may be positioned along a first metal layer of the electronic package (e.g., along a bottom surface of dielectric layer $315_A$), and the second trace 347 may be positioned along a second metal layer of the electronic package (e.g., along a bottom surface of dielectric layer $315_B$). The trench via 349 may extend between the first metal layer and the second metal layer (e.g., passing through a portion of the thickness of dielectric layer $315_A$).

In an embodiment, the differential signaling trace 343 may have a substantially uniform width $W_1$. For example, sidewalls of the first trace 348, the second trace 347, and the trench via 349 may be substantially aligned. Such an embodiment may be provided by using self-aligned lithographic via patterning.

Figure 3B:
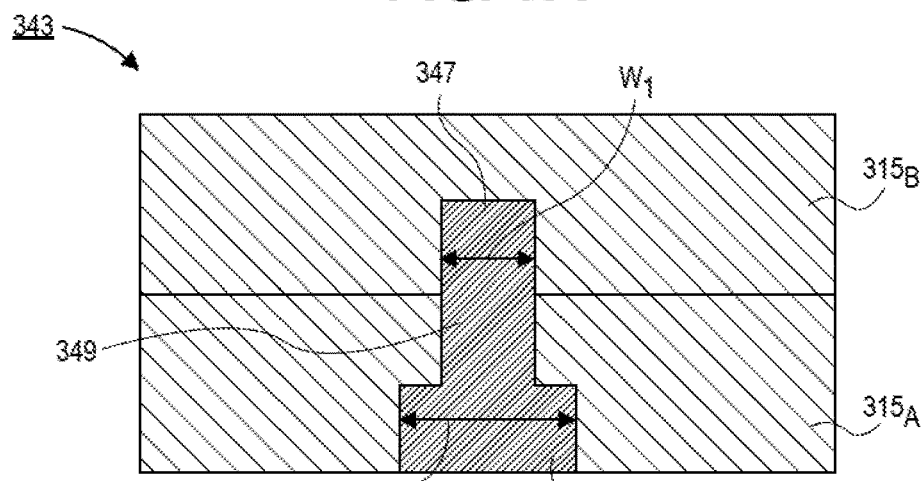
FIG. 3B is a cross-sectional illustration of a differential signaling trace with a first end that has a width that is wider than a width between the first end and the second end, in accordance with an embodiment.

Referring now to FIG. 3B, a cross-sectional illustration of a differential signaling trace 343 with a non-uniform width is shown, in accordance with an embodiment. In an embodiment, the differential signaling trace 343 may have a first width $W_1$ and a second width $W_2$ that is different than the first width $W_1$. For example, the first trace 348 may have the second width $W_2$, and the trench via 349 and the second trace 347 may have the first width $W_1$. In an embodiment, the trench via 349 may be formed with a lithographic via patterning process that has some inherent misalignment. As such, the width $W_2$ of the first trace 348 may be larger than the width $W_1$ of the trench via 349 in order to accommodate any misalignment. In an embodiment, the trench via 349 may be aligned with the second trace 347. That is, the trench via 349 may have sidewalls that are aligned with the second trace 347. Such an embodiment may be fabricated with self-aligned lithographic patterning.

Figure 3C:
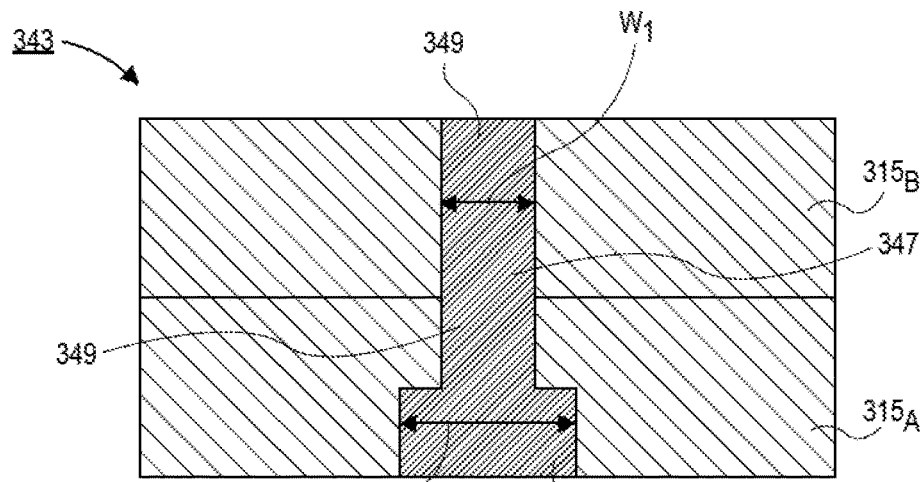
FIG. 3C is a cross-sectional illustration of a differential signaling trace that has a thickness that is greater than a distance between two metal layers, in accordance with an embodiment.

Referring now to FIG. 3C, a cross-sectional illustration of a differential signaling trace 343 is shown, in accordance with an additional embodiment. The differential signaling trace 343 in FIG. 3C is substantially similar to the differential signaling trace 343 in FIG. 3B, with the exception that an additional trench via 349 is positioned over the second trace 347. That is, the differential signaling trace 343 comprises a first trace 348, a first trench via 349 over the first trace 348, a second trace 347, and a second trench via 349 over the second trace 347. Accordingly, the differential signaling trace 343 may have a thickness that extends past two metal layers.

Figure 3D:
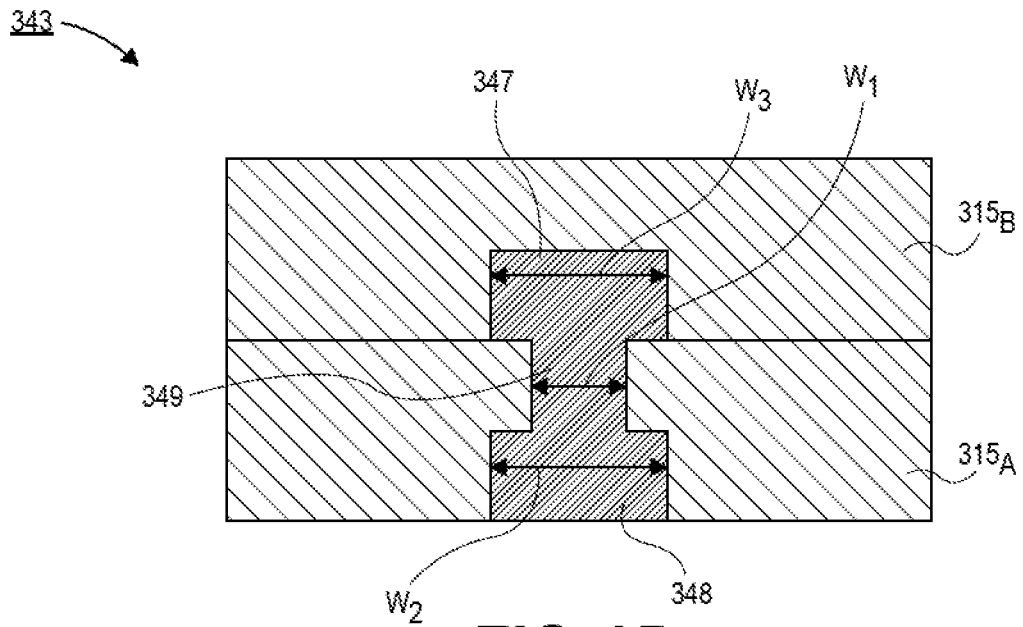
FIG. 3D is a cross-sectional illustration of a differential signaling trace with a first end and a second end that have widths that are wider than a width between the first end and the second end, in accordance with an embodiment.

Referring now to FIG. 3D, a cross-sectional illustration of a differential signaling trace 343 is shown, in accordance with an additional embodiment. In an embodiment, the differential signaling trace 343 in FIG. 3D is substantially similar to the differential signaling trace 343 in FIG. 3B, with the exception that the second trace 347 has a third width $W_3$. In an embodiment, the third width $W_3$ may be substantially similar to the second width $W_2$ of the first trace 348. In some embodiments, the differential signaling trace 343 may be referred to as being I-shaped.

Figure 3E:
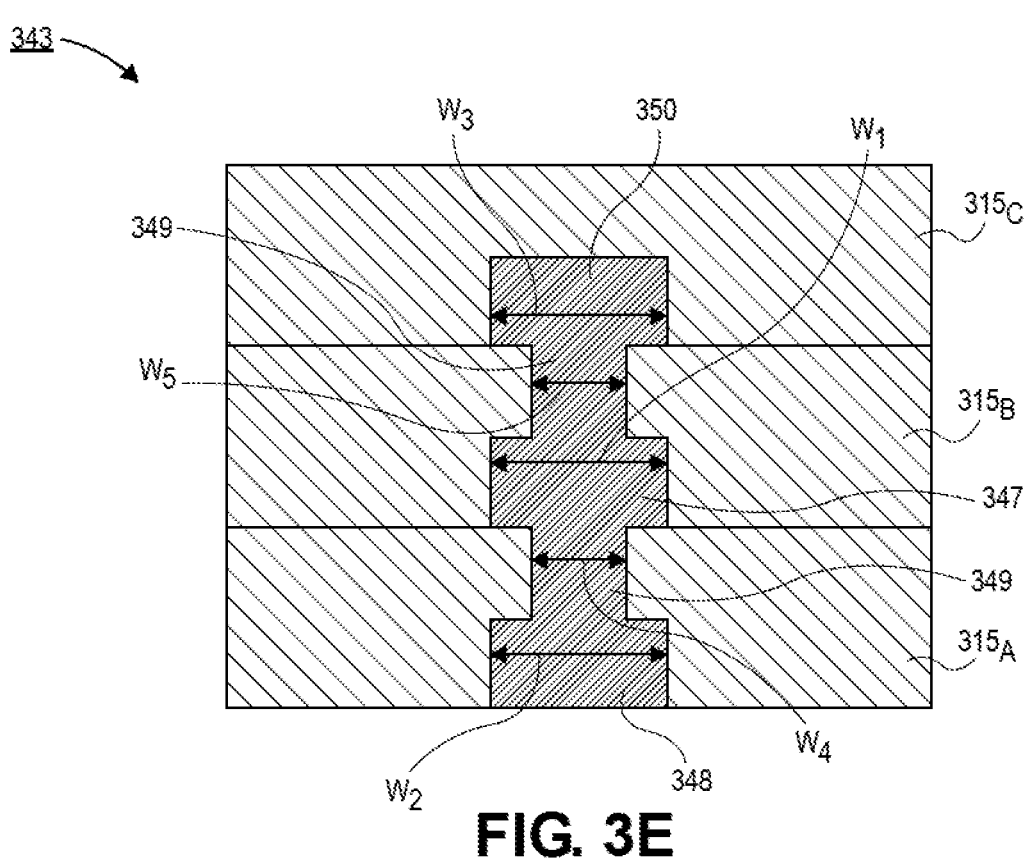
FIG. 3E is a cross-sectional illustration of a differential signaling trace with a thickness that is greater than a distance between two metal layers, and where the differential trace has a non-uniform width, in accordance with an embodiment.

Referring now to FIG. 3E, a cross-sectional illustration of a differential signaling trace 343 is shown, in accordance with an additional embodiment. The differential signaling trace 343 in FIG. 3E may be substantially similar to the differential signaling trace 343 in FIG. 3D, with the exception that an additional trench via 349 and a third trace 350 is positioned over the second trace 347. Accordingly, the differential signaling trace 343 may have a thickness that extends past two metal layers. For example, the first trace 348 may be on a first metal layer, the second trace 347 may be on a second metal layer, and the third trace 350 may be on a third metal layer. While a differential signaling trace 343 that spans three metal layers is shown (e.g., from dielectric layer $315_A$-$315_C$), it is to be appreciated that differential signaling traces 343 may have any desired thickness in order to provide a desired impedance. In an embodiment, the first trace 348, the second trace 347, and the third trace 350 may have widths $W_2$, $W_1$, and $W_3$, respectively. In an embodiment, the widths $W_1$-$W_3$ may be substantially equal to each other. In an embodiment, the trench vias 349 may have a width $W_4$ and $W_5$. The widths $W_4$ and $W_5$ may be smaller than the widths $W_1$-$W_3$.

Figure 4:
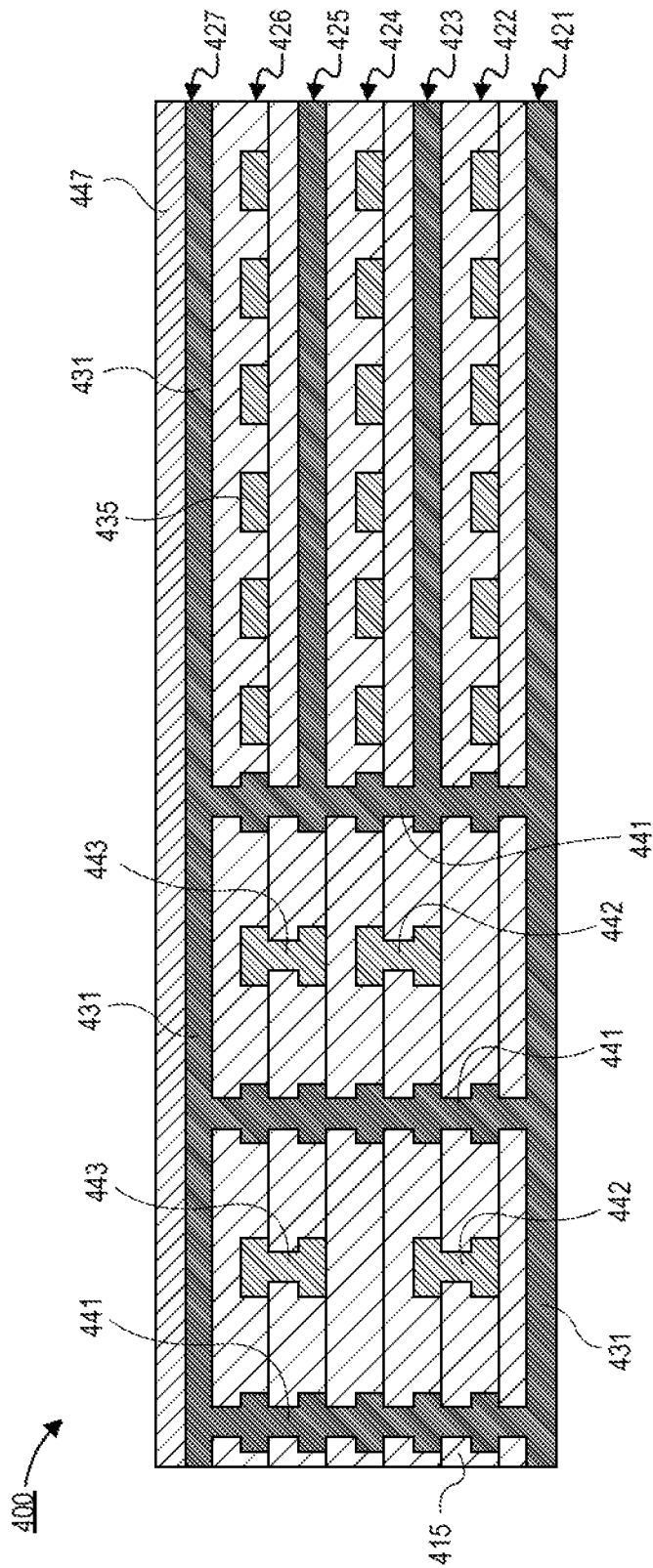
FIG. 4 is a cross-sectional illustration of an electronic package with a plurality of differential signaling traces aligned along a first plane and a plurality of single ended signaling traces aligned along a second plane, in accordance with an additional embodiment.

Referring now to FIG. 4, a cross-sectional illustration of an electronic package 400 is shown, in accordance with an additional embodiment. The electronic package 400 is substantially similar to the electronic package 100 in FIG. 1A, with the exception that the vertically oriented conductive features (e.g., the differential signaling traces 442, 443 and the vertically oriented ground planes 441) have non-uniform widths. For example, the differential signaling traces 442, 443 may have I-shaped cross-sections. The vertically oriented ground planes 441 may have repeating I-shaped cross-sections. That is, the portions of the vertically oriented conductive features on each metal layer 421-427 may have a larger width than the trench via portions between the metal layers. In other embodiments, the differential signaling traces 442, 443 and the vertically oriented ground planes 441 may have any cross-section such as those described above with respect to FIGS. 3A-3E.

Similar to FIG. 1A, the electronic package 400 may also include any number of dielectric layers 415 separating the metal layers 421-427. In the single ended signaling portion, a plurality of single ended signaling traces 435 may be positioned between horizontally oriented ground planes 431. In an embodiment, a solder resist 447 may be over the uppermost metal layer 427.

Figure 5A:
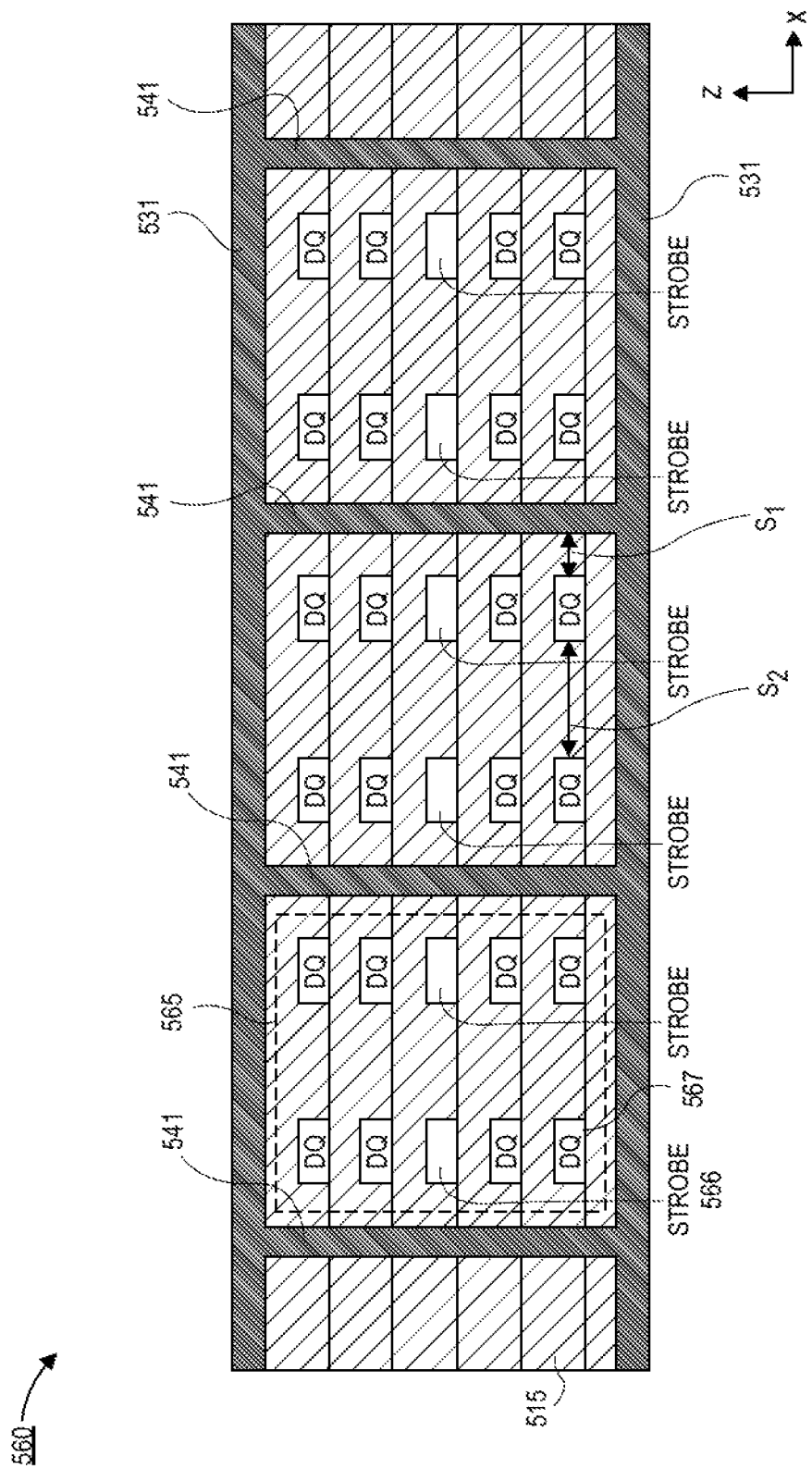
FIG. 5A is a cross-sectional illustration of an electronic package with a plurality of bytes of DDR with an in-plane signal to ground reference scheme, in accordance with an embodiment.
Figure 5B:
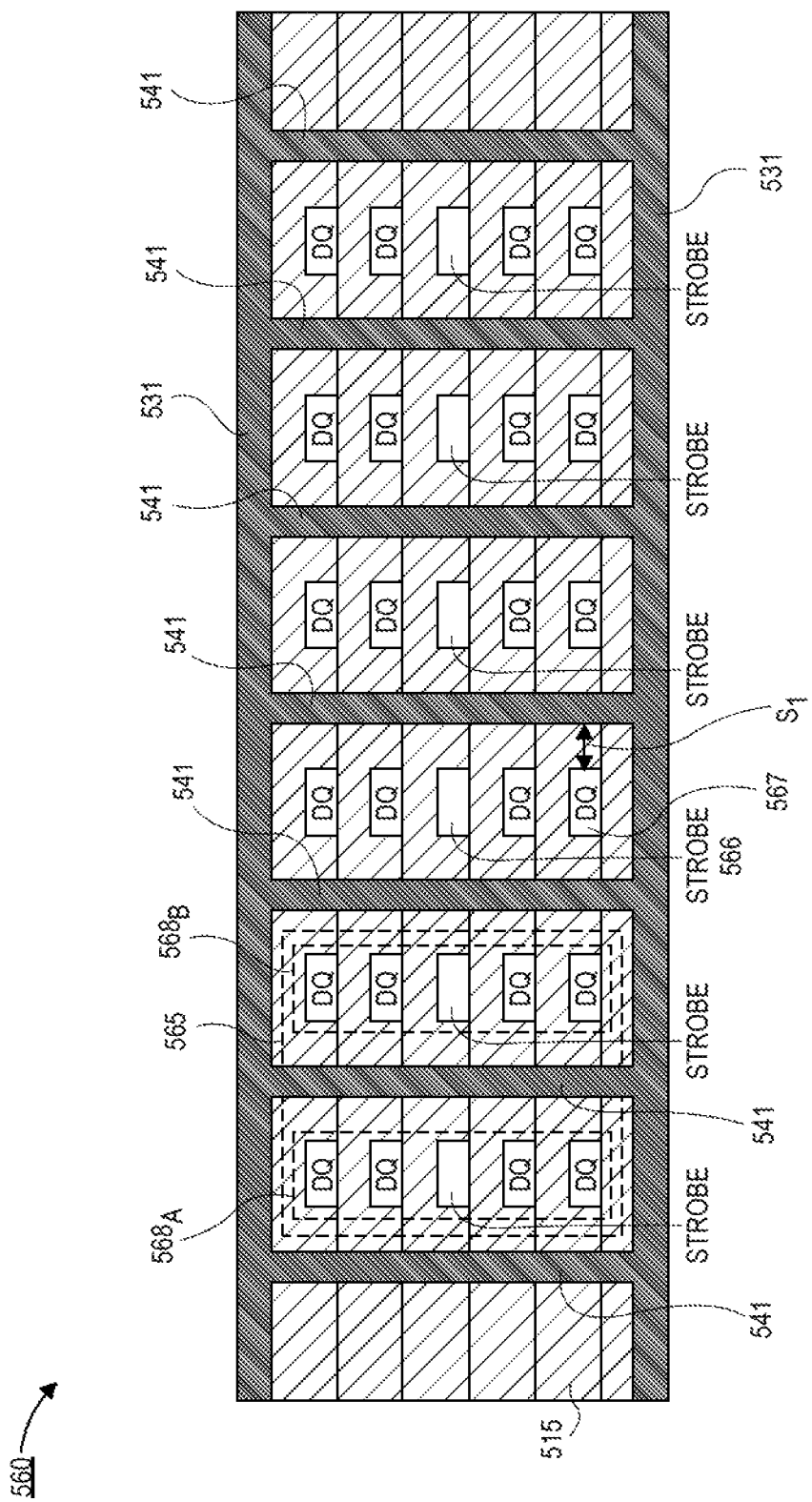
FIG. 5B is a cross-sectional illustration of an electronic package with a plurality of half-bytes of DDR with an in-plane signal to ground reference scheme, in accordance with an embodiment.

Referring now to FIGS. 5A and 5B, cross-sectional illustrations of electronic packages 560 that include double data rate (DDR) memory bytes that utilize variable in-plane referencing architectures are shown, in accordance with an embodiment. Such embodiments replace the traditional 3 channel, 3 layer routing typically required for DDR bytes. The use of variable in-plane referencing allows for tuning the signal to ground reference distance on the X-axis to a very small value. The small spacing allows for the DDR I/Os to be routed on adjacent layers with traditional build up metal layers while vertically oriented ground planes are formed using lithographic via processes. Accordingly, the routing density of multi-channel DDR can be increased, and the byte lane to byte lane cross-talk isolation is improved.

Referring now to FIG. 5A, a cross-sectional illustration of an electronic package 560 is shown, in accordance with an embodiment. The electronic package 560 may comprise a plurality of bytes 565. Each byte 565 may be laterally isolated from neighboring bytes 565 by vertically oriented ground planes 541. The vertically oriented ground planes 541 may be substantially similar to the vertically oriented ground planes 141, 241, 441 described above. For example, while shown as having uniform widths, the vertically oriented ground planes 541 may also include I-shaped sections to account for any misalignment between layers. In an embodiment, horizontally oriented ground planes 531 may be positioned above and below each byte 565. Accordingly, cross-talk between bytes 565 is mitigated due to the ground planes 541, 531 that surround each byte.

In an embodiment, each byte 565 may comprise data lanes (DQ) 567 and strobe lanes 566 embedded in the dielectric layers 515. For example, each byte 565 in FIG. 5A includes eight data lanes 567 and two strobe lanes 566. Each metal layer within a byte 565 may comprise two of the lanes (i.e., the data lanes 567 or strobe lanes 566).

The routing density may be increased compared to traditional DDR architectures due to the flexibility in positioning the vertically oriented ground planes 541 with respect to the neighboring lanes 566, 567. For example, a first spacing $S_1$ between an edge of the vertically oriented ground plane 541 and an edge of a lane 566, 567 may be smaller than the required second spacing $S_2$ between lanes 566, 567 on a single metal layer in the byte 565. This allows for compacting the bytes 565 in the X-direction compared to existing DDR architectures which require the second spacing $S_2$ between all of the lanes on a single metal layer.

Referring now to FIG. 5B, a cross-sectional illustration of an electronic package 560 is shown, in accordance with an additional embodiment. The electronic package 560 may be substantially similar to the electronic package 560 in FIG. 5A, with the exception that each byte is 565 is segmented into half-bytes $568_A$ and $568_B$. The half-bytes $568_A$ and $568_B$ may be isolated from each other by vertically oriented ground planes 541. Accordingly, the lanes 566, 567 in each-half byte 568 may be spaced a distance $S_1$ from a ground plane 541.

Referring now to FIGS. 6A and 6B, a plan view and cross-sectional illustration a die side capacitor (DSC) and a connection to a die on an electronic package 670 are shown, respectively, in accordance with an embodiment. Instead of using a horizontally oriented VCC flood plane to make the connection (with a ground plane in a layer below the VCC flood plane), vertically oriented VCC and ground planes may be implemented. The use of vertically oriented connections allows for a reduction in the footprint, while still obtaining the same electrical performance.

Referring now to FIG. 6A, a die 675 is on a package substrate 615. A DSC 677 is positioned proximate to the die 675. In an embodiment, the VCC plane 678 and the ground plane 641 extend out from the die 675 towards the DSC 677. Instead of being horizontally oriented the VCC plane 678 and the ground plane 641 are oriented vertically, as shown in the cross-section along line B-B' illustrated in FIG. 6B. As shown, the VCC plane 678 and the ground plane 641 have I-shaped cross-sections. However, it is to be appreciated that any cross-section, such as those described above with respect to FIGS. 3A-3E may be used to form VCC plane 678 and the ground plane 641.

Figure 7:
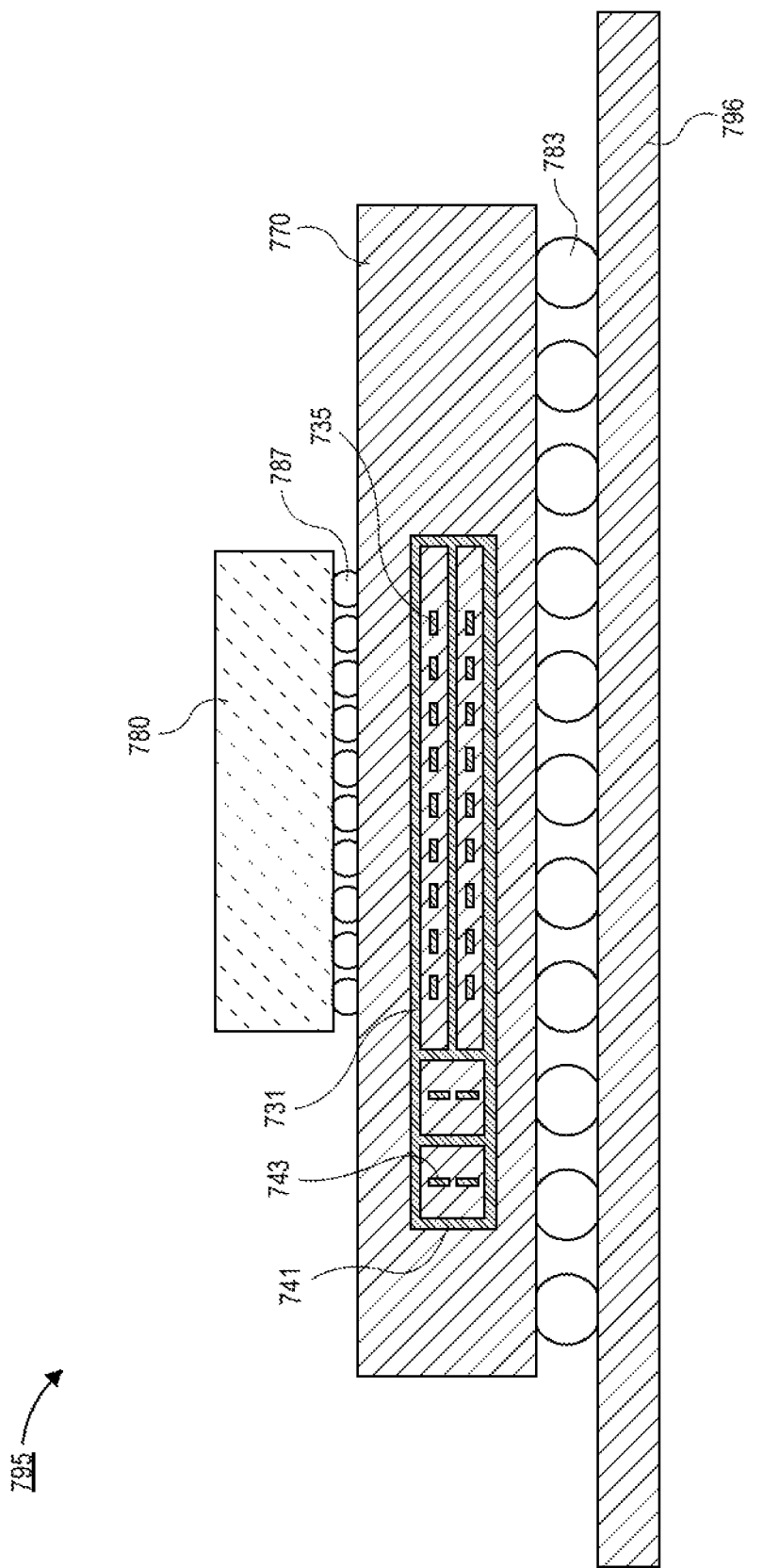
FIG. 7 is a cross-sectional illustration of an electronic system that comprises a package with in-plane signal to ground reference architectures, in accordance with an embodiment.

Referring now to FIG. 7, a cross-sectional illustration of a packaged system 795 is shown, in accordance with an embodiment. In an embodiment, the packaged system 795 may include a die 780 electrically coupled to a package substrate 770 with solder bumps 787. In additional embodiments, the die 780 may be electrically coupled to the package substrate 770 with any suitable interconnect architecture, such as wire bonding or the like. The package substrate 770 may be electrically coupled to a board 796, such as a printed circuit board (PCB) with solder bumps 783 or any other suitable interconnect architecture, such as wire bonding or the like.

In an embodiment, variable in-plane signal to ground reference architectures may be integrated into the package substrate 770 or the board 796, or the package substrate 770 and the board 796. Embodiments include any number of vertically oriented ground planes 741 that are used for providing variable signal to ground reference distances to provide desired electrical performance. For example, vertically oriented ground planes 741 may be used to provide improved performance for differential signaling traces 743, for electrically isolating bytes (or half-bytes) in DDR interfaces, or for providing reduced footprints of power deliver components. In an embodiment the package substrate 770 may also comprise horizontally oriented ground planes 731 and single ended signaling traces 735.

Figure 8:
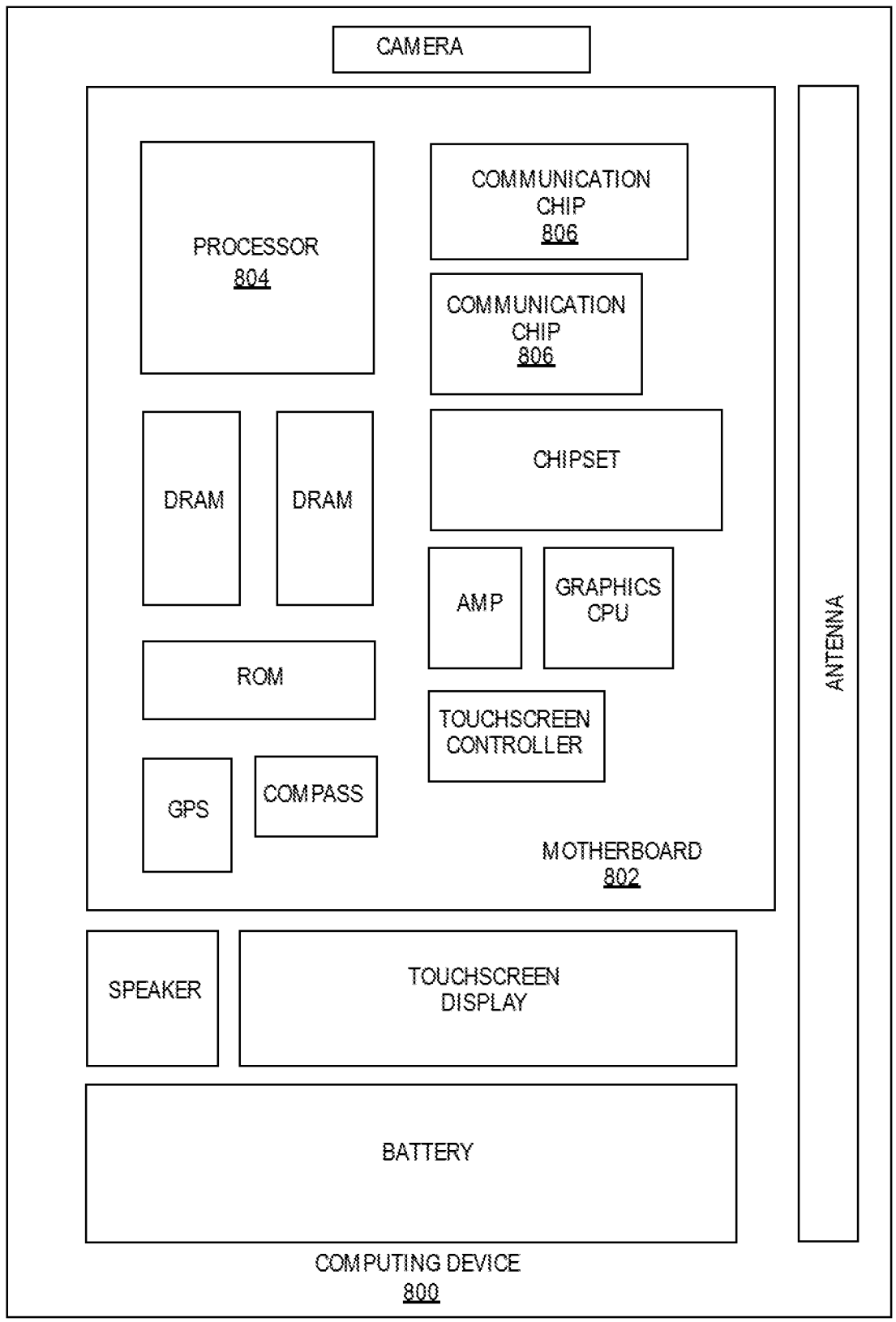
FIG. 8 is a schematic of a computing device built in accordance with an embodiment.

FIG. 8 illustrates a computing device 800 in accordance with one implementation of the invention. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the invention, the integrated circuit die of the processor may be packaged in an electronic system that comprises an electronic package that comprises variable in-plane signal to ground reference architectures, in accordance with embodiments described herein. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of the invention, the integrated circuit die of the communication chip may be packaged in an electronic system that comprises an electronic package that comprises variable in-plane signal to ground reference architectures, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1 an electronic package, comprising: a package substrate, wherein the package substrate comprises alternating metal layers and dielectric layers; a first trace embedded in the package substrate, wherein the first trace has a first thickness that extends from a first metal layer to a second metal layer; a first ground plane laterally adjacent to a first side of the first trace; and a second ground plane laterally adjacent to a second side of the first trace.

Example 2 the electronic package of Example 1, wherein the first ground plane and the second ground plane have a second thickness that is greater than a thickness of the first trace.

Example 3 the electronic package of Example 1 or Example 2, wherein the first trace has a width that is less than the first thickness.

Example 4 the electronic package of Examples 1-3, further comprising a second trace embedded in the package substrate, wherein the second trace is below the first trace and aligned with the first trace.

Example 5 the electronic package of Examples 1-4, wherein the first trace and the second trace form a differential input/out (I/O) pair.

Example 6 the electronic package of Examples 1-5, wherein the first trace is closer to the first ground plane than to the second ground plane.

Example 7 the electronic package of Examples 1-6, wherein a distance between the first trace and the first ground plane is equal to a distance between the first trace and the second ground plane.

Example 8 the electronic package of Examples 1-7, wherein the distance between the first trace and the first ground plane is greater than a thickness of one of the dielectric layers.

Example 9 the electronic package of Examples 1-8, wherein the first ground plane is electrically coupled to the second ground plane by lateral ground planes, wherein the first ground plane, the second ground plane, and the lateral ground planes surround the first trace.

Example 10 the electronic package of Examples 1-9, wherein the first trace comprises a first end and a second end opposite from the first end, and wherein the first end comprises a first width that is greater than a second width of the first trace between the first end and the second end.

Example 11 the electronic package of Examples 1-10, wherein the second end comprises a third width that is greater than the second width of the first trace between the first end and the second end.

Example 12 the electronic package of Examples 1-11, wherein the first thickness extends from the first metal layer to a third metal layer, wherein the second metal layer is between the first metal layer and the third metal layer.

Example 13 an electronic package, comprising: a package substrate, wherein the package substrate comprises alternating metal layers and dielectric layers; a plurality of single ended signaling traces, wherein the plurality of single ended signaling traces comprise a first width and a first thickness, wherein the first width is greater than the first thickness; a first ground plane over the plurality of single ended signaling traces; a second ground plane under the plurality of single ended signaling traces; a plurality of differential signaling traces, wherein the plurality of differential signaling traces comprise a second width and a second thickness, wherein the second width is less than the second thickness; a third ground plane laterally adjacent to the plurality of differential signaling traces; and a fourth ground plane laterally adjacent to the plurality of differential signaling traces.

Example 14 the electronic package of Example 13, wherein the plurality of single ended signaling traces are spaced away from the first ground plane by a first distance, and wherein the plurality of differential signaling traces are spaced away from the third ground plane by a second distance, wherein the second distance is greater than the first distance.

Example 15 the electronic package of Example 13 or Example 14, wherein the first distance is equal to a distance between a first metal layer and a second metal layer of the alternating metal layers and dielectric layers.

Example 16 the electronic package of Examples 13-15, wherein the single ended signaling traces are single ended memory interfaces.

Example 17 the electronic package of Examples 13-16, wherein the differential signaling traces are serializer/deserializer (SERDES) interfaces or peripheral component interconnect express (PCIe) interfaces.

Example 18 the electronic package of Examples 13-17, wherein the thickness of the plurality of differential signaling traces is greater than a thickness of a metal layer of the alternating metal layers and dielectric layers.

Example 19 the electronic package of Examples 13-18, wherein the plurality of differential signaling traces comprises: a first differential signaling trace; and a second differential signaling trace, wherein the first differential signaling trace is above the second differential signaling trace and aligned with the second differential signaling trace.

Example 20 the electronic package of Examples 13-19, wherein the plurality of single ended signaling traces are aligned along a first plane, and wherein the plurality of differential signaling traces are aligned along a second plane that is substantially perpendicular to the first plane.

Example 21 the electronic package of Examples 13-20, wherein the first plane is parallel to the metal layers of the alternating metal layers and dielectric layers.

Example 22 an electronic system, comprising: a board; an electronic package attached to the board, wherein the electronic package comprises: a first high speed input output (HSIO) interface, wherein the first HSIO interface comprises first traces aligned along a first plane; and a second HSIO interface, wherein the second HSIO interface comprises second traces aligned along a second plane, wherein the second plane is substantially orthogonal to the first plane.

Example 23 the electronic system of Example 22, wherein the first HSIO interface is a single ended signaling interface, and wherein the second HSIO interface is a differential signaling interface.

Example 24 the electronic system of Example 22 or Example 23, wherein the first HSIO interface is spaced away from a first ground plane by a first distance, and wherein the second HSIO interface is spaced away from a second ground plane by a second distance that is greater than the first distance.

Example 25 the electronic system of Examples 22-24, wherein the second traces have a width and a thickness, wherein a thickness direction is along the second plane, and wherein the thickness is greater than the width.

What is claimed is:
1. An electronic package, comprising:
a package substrate,
wherein the package substrate comprises alternating metal layers and dielectric layers;
a first trace embedded in the package substrate,
wherein the first trace has a first thickness that extends from a bottom of a first metal layer to a top of a second metal layer,
the second metal layer above the first metal layer,
and wherein the first trace has a same width throughout the first thickness;
a first ground plane laterally adjacent to a first side of the first trace;
and a second ground plane laterally adjacent to a second side of the first trace,
wherein the first ground plane is electrically coupled to the second ground plane by lateral ground planes,
wherein the first ground plane, the second ground plane, and the lateral ground planes surround the first trace,
and wherein the first thickness extends from the first metal layer to a third metal layer,
wherein the second metal layer is between the first metal layer and the third metal layer.
2. The electronic package of claim 1, wherein the first ground plane and the second ground plane have a second thickness that is greater than a thickness of the first trace.
3. The electronic package of claim 1, wherein the first trace has the width that is less than the first thickness.
4. The electronic package of claim 1, further comprising a second trace embedded in the package substrate, wherein the second trace is below the first trace and aligned with the first trace.
5. The electronic package of claim 4, wherein the first trace and the second trace form a differential input/out (I/O) pair.
6. The electronic package of claim 1, wherein the first trace is closer to the first ground plane than to the second ground plane.
7. The electronic package of claim 1, wherein a distance between the first trace and the first ground plane is equal to a distance between the first trace and the second ground plane.
8. The electronic package of claim 7, wherein the distance between the first trace and the first ground plane is greater than a thickness of one of the dielectric layers.
9. An electronic package, comprising:
a package substrate,
wherein the package substrate comprises alternating metal layers and dielectric layers;
a plurality of single ended signaling traces, wherein the plurality of single ended signaling traces comprise a first width and a first thickness,
wherein the first width is greater than the first thickness;
a first ground plane over the plurality of single ended signaling traces;

a second ground plane under the plurality of single ended signaling traces;
a plurality of differential signaling traces,
wherein the plurality of differential signaling traces comprise a second width and a second thickness,
the second thickness extending from a bottom of a first metal layer to a top of a second metal layer,
the second metal layer above the first metal layer,
wherein the second width is less than the second thickness, and wherein the second width is throughout the second thickness;
a third ground plane laterally adjacent to the plurality of differential signaling traces;
and a fourth ground plane laterally adjacent to the plurality of differential signaling traces,
wherein the first ground plane is electrically coupled to the second ground plane by lateral ground planes,
wherein the first ground plane, the second ground plane, and the lateral ground planes surround the first trace,
and wherein the first thickness extends from the first metal layer to a third metal layer,
wherein the second metal layer is between the first metal layer and the third metal layer.

10. The electronic package of claim 9, wherein the plurality of single ended signaling traces are spaced away from the first ground plane by a first distance, and wherein the plurality of differential signaling traces are spaced away from the third ground plane by a second distance, wherein the second distance is greater than the first distance.

11. The electronic package of claim 10, wherein the first distance is equal to a distance between a first metal layer and a second metal layer of the alternating metal layers and dielectric layers.

12. The electronic package of claim 9, wherein the single ended signaling traces are single ended memory interfaces.

13. The electronic package of claim 9, wherein the differential signaling traces are serializer/deserializer (SERDES) interfaces or peripheral component interconnect express (PCIe) interfaces.

14. The electronic package of claim 9, wherein the thickness of the plurality of differential signaling traces is greater than a thickness of a metal layer of the alternating metal layers and dielectric layers.

15. The electronic package of claim 9, wherein the plurality of differential signaling traces comprises: a first differential signaling trace, wherein the first differential signaling trace has a same width throughout a thickness of the first differential signaling trace; and a second differential signaling trace, wherein the first differential signaling trace is above the second differential signaling trace and aligned with the second differential signaling trace.

16. The electronic package of claim 9, wherein the plurality of single ended signaling traces are aligned along a first plane, and wherein the plurality of differential signaling traces are aligned along a second plane that is perpendicular to the first plane.

17. The electronic package of claim 16, wherein the first plane is parallel to the metal layers of the alternating metal layers and dielectric layers.

18. An electronic system, comprising:
a board;
an electronic package attached to the board,
wherein the electronic package comprises:
a first high speed input output (HSIO) interface,
wherein the first HSIO interface comprises first traces aligned along a first plane,
wherein each of the first traces has a same width throughout a thickness of the first trace,
the thickness extending from a bottom of a first metal layer to a top of a second metal layer,
the second metal layer above the first metal layer;
and a second HSIO interface,
wherein the second HSIO interface comprises second traces aligned along a second plane,
wherein the second plane is orthogonal to the first plane,
wherein the first HSIO interface is spaced away from a first ground plane by a first distance,
and wherein the second HSIO interface is spaced away from a second ground plane by a second distance that is greater than the first distance,
wherein the first ground plane is electrically coupled to the second ground plane by lateral ground planes,
wherein the first ground plane, the second ground plane, and the lateral ground planes surround the first trace,
and wherein the first thickness extends from the first metal layer to a third metal layer,
wherein the second metal layer is between the first metal layer and the third metal layer.

19. The electronic system of claim 18, wherein the first HSIO interface is a single ended signaling interface, and wherein the second HSIO interface is a differential signaling interface.

20. The electronic system of claim 18, wherein the second traces have a width and a thickness, wherein a thickness direction is along the second plane, and wherein the thickness is greater than the width.

* * * * *